US012067264B2

(12) United States Patent
Gad et al.

(10) Patent No.: US 12,067,264 B2
(45) Date of Patent: Aug. 20, 2024

(54) POWER EFFICIENT CODEWORD SCRAMBLING IN A NON-VOLATILE MEMORY DEVICE

(71) Applicant: Micron Technology, Inc., Boise, ID (US)

(72) Inventors: Eyal En Gad, Santa Clara, CA (US); Zhengang Chen, San Jose, CA (US); Yoav Weinberg, Toronto (CA)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 17/829,920

(22) Filed: Jun. 1, 2022

(65) Prior Publication Data

US 2023/0393765 A1 Dec. 7, 2023

(51) Int. Cl.
 *G06F 3/06* (2006.01)
(52) U.S. Cl.
 CPC .......... *G06F 3/0623* (2013.01); *G06F 3/0655* (2013.01); *G06F 3/0679* (2013.01)
(58) Field of Classification Search
 CPC ..... G06F 3/0623; G06F 3/0655; G06F 3/0679
 See application file for complete search history.

(56) References Cited

U.S. PATENT DOCUMENTS

| 2015/0010290 | A1* | 1/2015 | Joong | H04N 21/4334 |
| | | | | 386/248 |
| 2016/0028544 | A1* | 1/2016 | Hyde | H04L 9/0662 |
| | | | | 711/112 |
| 2016/0085467 | A1* | 3/2016 | Saxena | G06F 11/2071 |
| | | | | 714/766 |
| 2018/0103101 | A1* | 4/2018 | Volvovski | H03M 13/3761 |
| 2020/0371752 | A1* | 11/2020 | Murray | H04L 9/0869 |
| 2021/0359846 | A1* | 11/2021 | Wright | G06F 16/2237 |
| 2022/0179567 | A1* | 6/2022 | Suzuki | G06F 3/0679 |

* cited by examiner

*Primary Examiner* — Tasnima Matin
(74) *Attorney, Agent, or Firm* — Lowenstein Sandler LLP

(57) ABSTRACT

A processing device in a memory sub-system receives a request to perform a memory access operation on a memory device, determines a memory segment identifier associated with the memory access operation, and applies a hash function to the memory segment identifier to generate a hashed seed. The processing device further provides the hashed seed to a pseudo-random number generator to generate a randomized string, and performs the memory access operation on the memory device using the randomized string.

20 Claims, 5 Drawing Sheets

POWER EFFICIENT CODEWORD SCRAMBLING IN A NON-VOLATILE MEMORY DEVICE

TECHNICAL FIELD

Embodiments of the disclosure relate generally to memory sub-systems, and more specifically, relate to power efficient codeword scrambling in a non-volatile memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
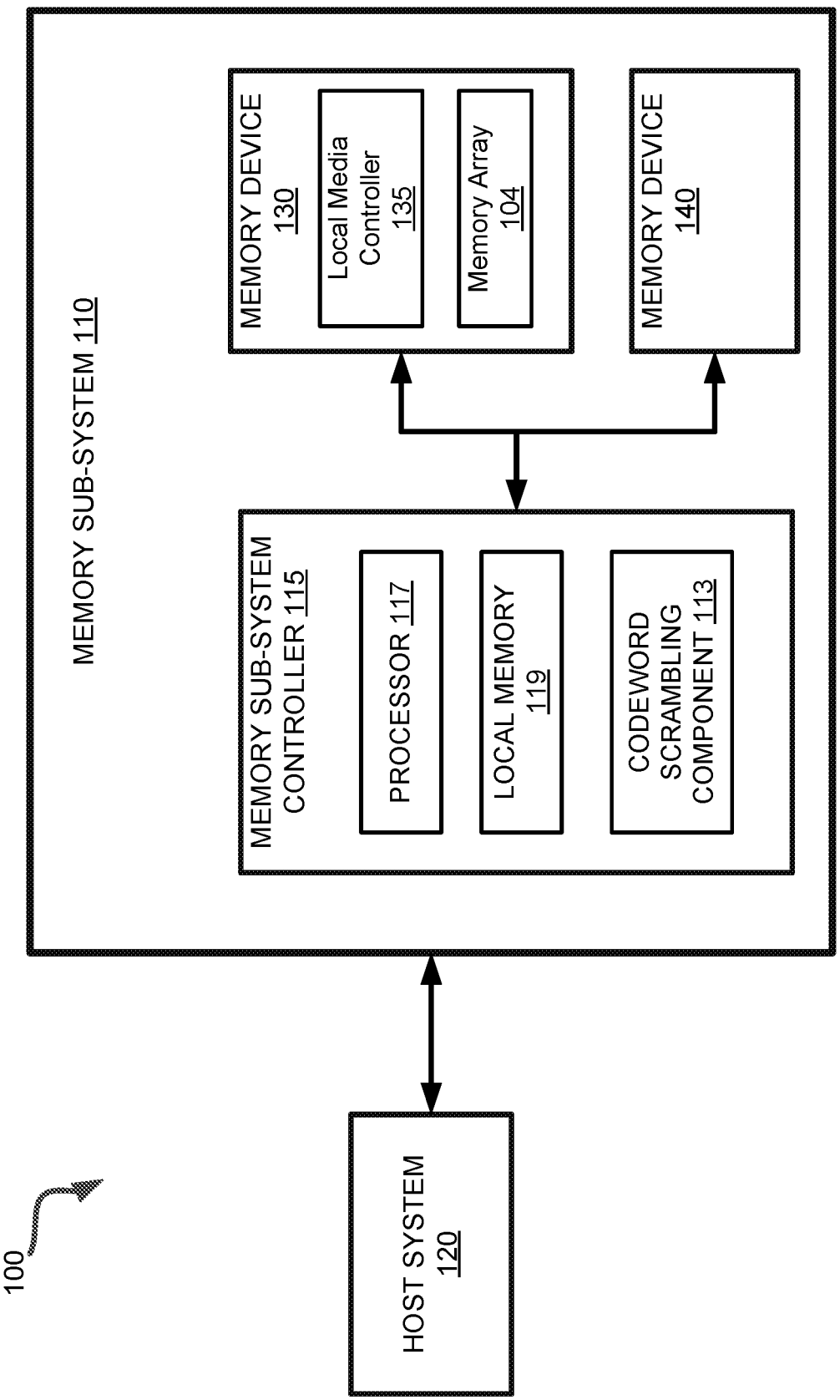
FIG. 1A illustrates an example computing system that includes a memory sub-system in accordance with some embodiments of the present disclosure.

Aspects of the present disclosure are directed to power efficient codeword scrambling in a non-volatile memory device of a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. The memory sub-system controller can encode data into a format for storage at the memory device(s). For example, a class of error detection and correcting codes (ECC), such as low density parity check (LDPC) codes, can be used to encode the data. LDPC codes are capacity-approaching codes, which means that practical constructions exist which allow the error threshold to be set very close to a theoretical maximum. This error threshold defines an upper bound for errors in the data, up to which the probability of lost information can be made as small as desired. LDPC codes are reliable and highly efficient, making them useful in bandwidth-constrained applications. For example, encoded data written to physical memory cells of a memory device can be referred to as a codeword. The data read from the cells, which might include errors and differ from the codeword, can be referred to as a sense word. The sense word can include one or more of user data, error correcting code, metadata, or other information.

The storing of the codeword or the requesting of the sense word can be based on random values (e.g., random numbers). For example, the memory sub-system controller can scramble the codeword by utilizing a random value during a scrambling operation and storing the scrambled data on the memory device(s). The scrambled data can be stored by the memory sub-system in a pattern different from a pattern in which the unscrambled codeword would have been stored. By scrambling the codeword (e.g., the write data), the memory sub-system can distribute the write data more uniformly across the wordlines and bitlines of a block of the memory device, which allows for a more even voltage distribution (e.g., a balance of cells programmed to a logical '1' and to a logical '0') and reduced overuse of the same memory cells.

Certain memory sub-system controllers utilize a hash function to scramble the codeword to be written. For example, a subset of the codeword (e.g., 2 bytes) can be applied to the hash function as an input, and the output, by virtue of one or more mathematical operations performed (e.g., a power consuming multiplication with a prime number of 10 decimal digits), can include the resulting hash. The output thus has very strong randomization, but the expansive computational requirements result in very high power consumption, making the approach impractical for certain applications (e.g., in mobile devices). Other memory sub-system controllers can utilize a pseudorandom number generator (PRNG) (e.g., a randomizer) to generate the random values. For example, the memory sub-system can provide an initial value (e.g., a seed value) to the PRNG, such as a linear feedback shift register for example, and the PRNG can proceed to output a randomized sequence based on the seed value. The PRNG is deterministic since the output of the PRNG is based on the seed value that is provided to the PRNG. For example, if the seed value used includes a portion of the row index from the memory array, a portion of the physical block address (PBA), or some other value associated with the wordline on which the data is to be written, the randomness of the output of the PRNG can be reduced. The PRNG is therefore susceptible to reusing specific data patterns or portions of data patterns in different wordlines of the memory device. Repeatedly programming memory cells with the same data pattern (e.g., programming on the same bitline or on the same wordline to the same data state), can cause issues such as program disturb and premature degradation of the memory cells, as well as limit the effectiveness of certain error detection and correcting codes.

Aspects of the present disclosure address the above and other deficiencies by providing power efficient codeword scrambling in a non-volatile memory device of a memory sub-system. In one embodiment, when performing a program operation, the memory sub-system controller can use a wordline dependent seed value (e.g., the row index for the memory array) and apply a hash function to generate a hash of the seed value. The hash of the seed value can then be used with a PRNG, such as a linear feedback shift register, to generate a randomized string for use in programming a codeword to the wordline of a memory array of the memory device.

Advantages of the approach described herein include, but are not limited to, improved performance in the memory sub-system. Since the hash function provides strong randomization, its use can eliminate any dependencies between the seeds used to generate the random numbers for programming memory cells associated with each wordline. By hashing only the seed rather than the entire codeword, the hash function need only be used once per wordline of the block (e.g., about 4 k bytes), thereby providing a significant power savings. The linear feedback shift register, is a very power efficient function (e.g., using only a simple XOR function to generate each bit) and since the hash of the seed value eliminates any wordline dependency, the resulting output provides sufficient randomness to enable efficient program and read operations to be performed on the memory array.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 includes local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes a codeword scrambling component 113 that can perform scrambling and descrambling operations with respect to data being written to or read from memory array 104 of memory device 130. In one embodiment, in response to a request to perform a program operation, codeword scrambling component 113 can identify an address, index, or other identifier associated with a location in memory array 104 where data (e.g., a codeword) is to be programmed and apply a hash function to that value to generate a hash. Codeword scrambling component 113 can use that hash as the seed value for a linear feedback shift register or other pseud-random number generator to generate a randomized string for use in programming the data to the location in memory array 104. In another embodiment, in response to a request to perform a read operation, codeword scrambling component 113 can identify an address, index, or other identifier associated with a location in memory array 104 from which data is to be read and apply the same hash function used when the data was programmed to that value to generate a hash. Codeword scrambling component 113 can use that hash as the seed value for a linear feedback shift register or other pseud-random number generator to generate a randomized string for use in reading the data from the location in memory array 104. Further details with regards to the operations of codeword scrambling component 113 are described below.

Figure 1B:
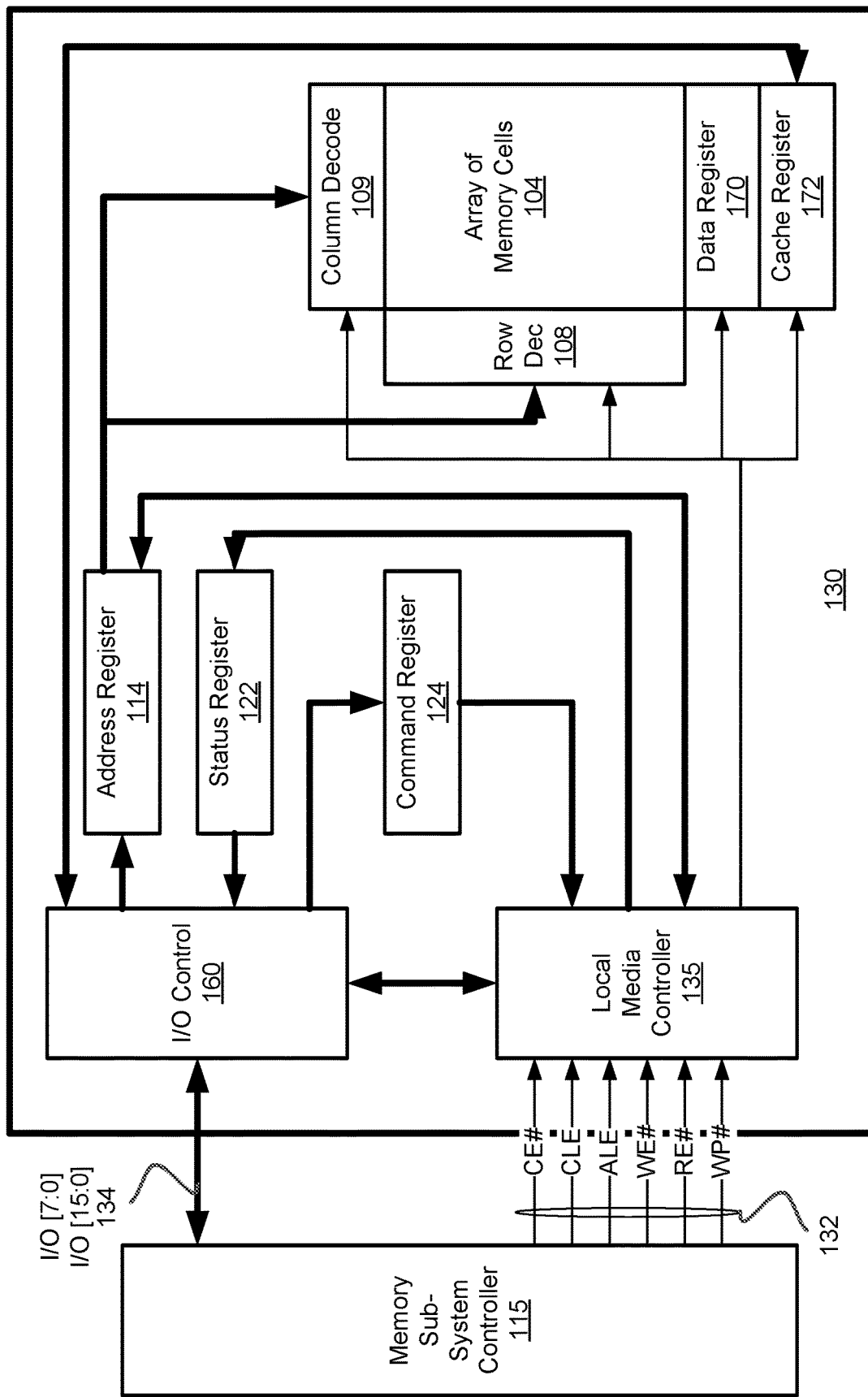
FIG. 1B is a block diagram of memory device(s) in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones, and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
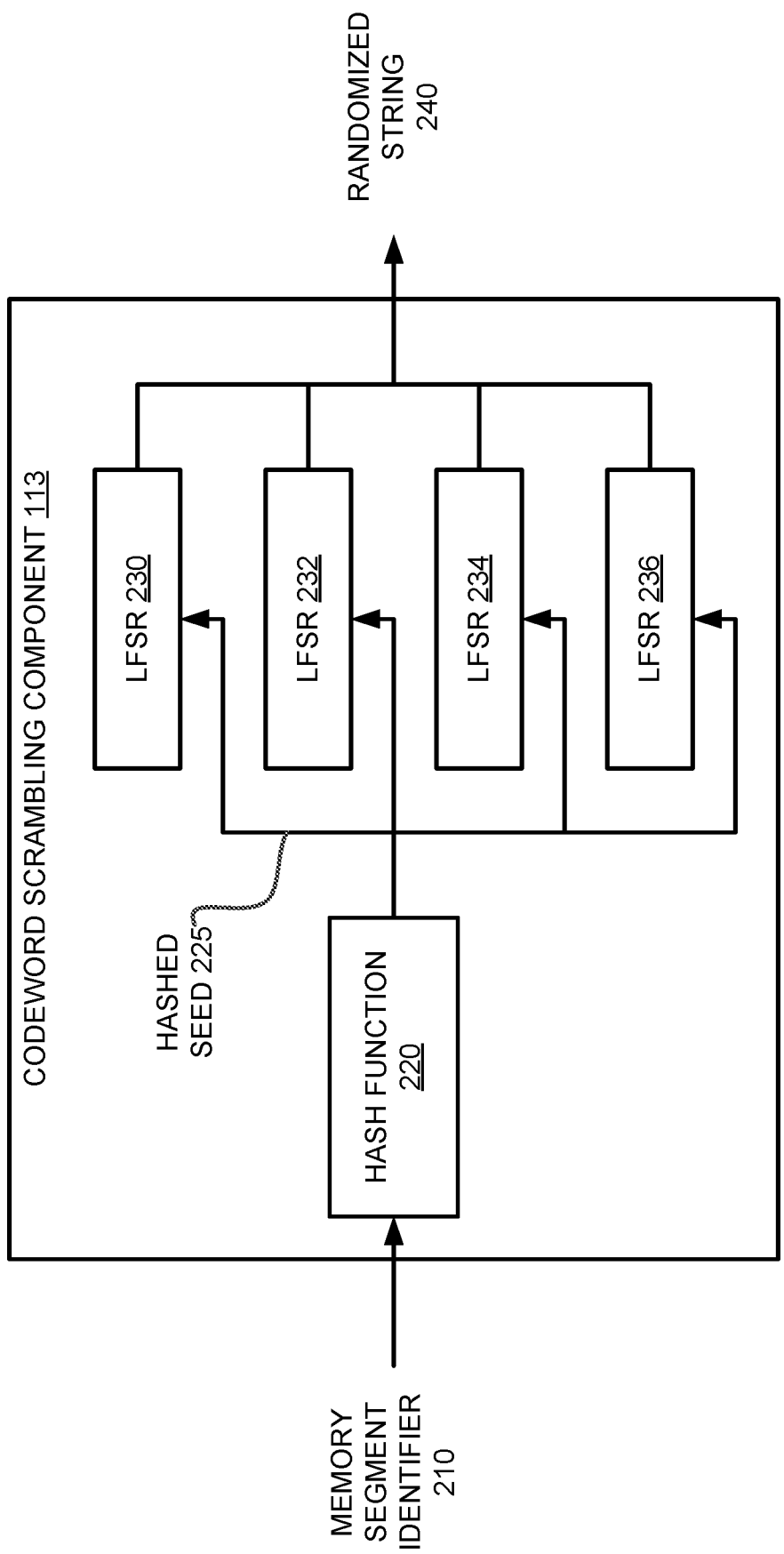
FIG. 2 is a block diagram illustrating a codeword scrambling component implementing power efficient codeword scrambling in a non-volatile memory device of a memory sub-system in accordance with some embodiments of the present disclosure.

FIG. 2 is a block diagram illustrating a codeword scrambling component implementing power efficient codeword scrambling in a non-volatile memory device of a memory sub-system in accordance with some embodiments of the present disclosure. In one embodiment, the codeword scrambling component 113 receives a memory segment identifier 210 as an input. Depending on the embodiment, the memory segment identifier 210 can be any value that uniquely identifies a location or group of locations (e.g., a wordline of a block) of a segment of a memory device, such as memory device 130. In one embodiment, the memory segment identifier 210 has a location-based dependency on at least one other value, such that there is some discernable relationship between the memory segment identifier 210 associated with one location and the memory segment identifier associated with another location. For example, the memory segment identifiers might be consecutive values if associated with adjacent memory locations. In other embodiments, the memory segment identifier 210 can be some other value.

In one embodiment, codeword scrambling component 113 applies hash function 220 to the memory segment identifier 210 to generate a hashed seed 225. Hash function 220 can include any function that can be used to map input data (e.g., memory segment identifier 210) to an output hash (e.g., hashed seed 225). Hash function 220 can take any of many possible forms but is generally fast to compute and minimizes the duplication of the output values (i.e., collisions). Thus, while the output hashed seed 225 is able to be recreated by applying the hash function 220 to the input data multiple times, the output hashed seed 225 generally has no discernable dependence on the input data and is generally different than the outputs generated when other input data are provided.

In one embodiment, codeword scrambling component 113 includes one or more pseudo-random number generators. For example, as illustrated in FIG. 2, codeword scrambling component 113 includes a number of linear feedback shift registers (LFSRs) 230, 232, 234, and 236. Depending on the embodiment, each of linear feedback shift registers 230, 232, 234, and 236 can be identical, or two or more of linear feedback shift registers 230, 232, 234, and 236 can have a different structure. In other embodiments, codeword scrambling component 113 can include some other number of linear feedback shift registers or some other type of pseudo-random number generators. In one embodiment, the hashed seed 225 (or other output of the hash function 220) is used as a seed value for each of linear feedback shift registers 230, 232, 234, and 236. During each clock cycle, each of feedback shift registers 230, 232, 234, and 236 can perform selected logic operations (e.g., Boolean logic operations) on certain bits of the seed to create a new bit value, shifts all the bits in the seed, and appends the new bit value at the start. The output bit falls off the end of the seed value, and as numerous clock cycles are repeated, a randomized sequence is generated. The process can be repeated for a number of clock cycles until the output sequence reaches a desired length. In one embodiment, codeword scrambling component 113 combines (e.g., concatenates) the randomized output sequences from each of feedback shift registers 230, 232, 234, and 236 to generate randomized string 240. As described in more detail below, randomized string 240 can be used to perform certain memory access operations (e.g., program and read operations) on a memory device, such as memory device 130.

Figure 3:
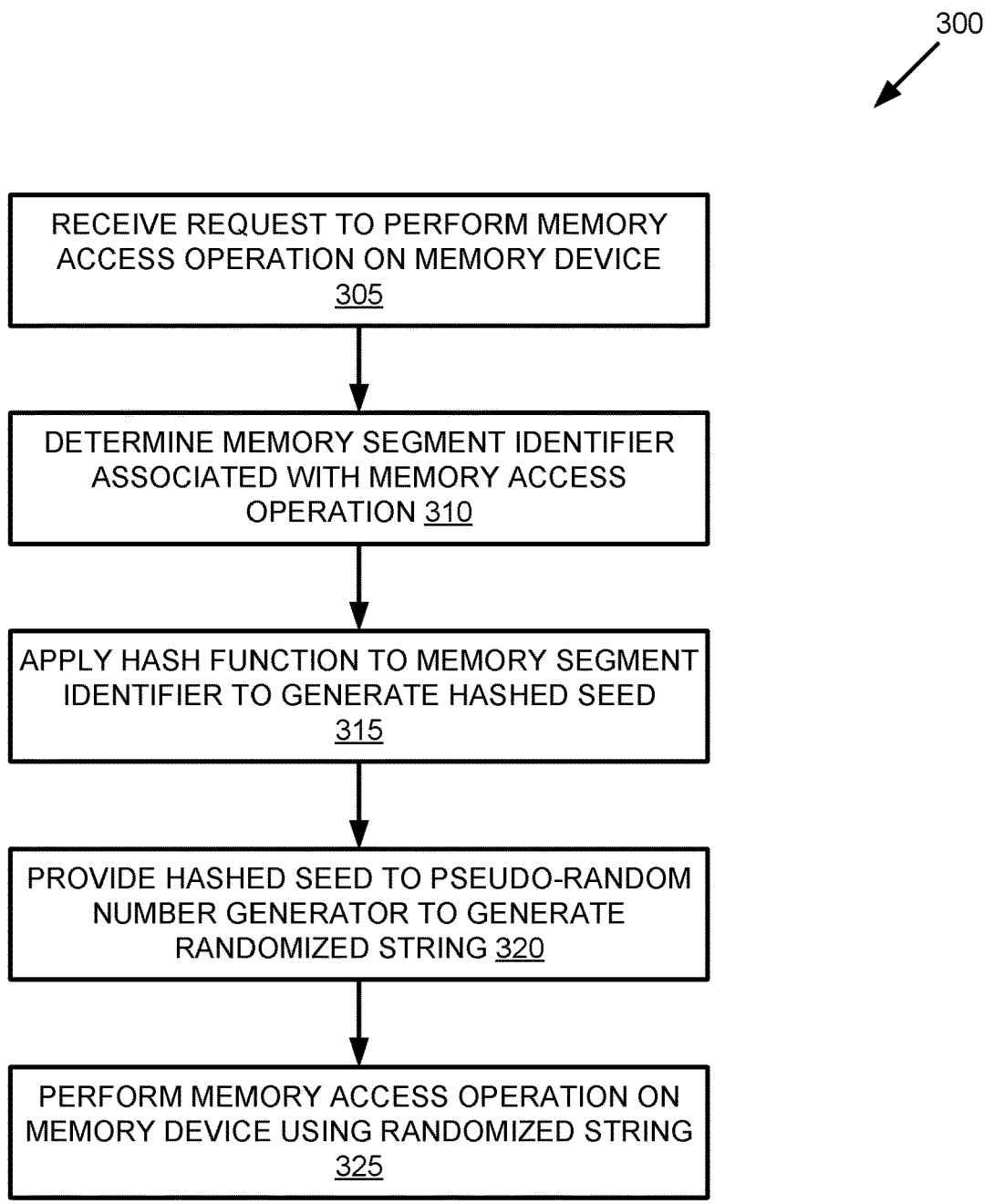
FIG. 3 is a flow diagram of an example method of power efficient codeword scrambling in a non-volatile memory device of a memory sub-system in accordance with some embodiments of the present disclosure.

FIG. 3 is a flow diagram of an example method of power efficient codeword scrambling in a non-volatile memory device of a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by codeword scrambling component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, a request is received. For example, the processing logic (e.g., codeword scrambling component 113) receives, from a requestor, a request to perform a memory access operation on a memory device, such as memory device 130. In one embodiment, memory sub-system controller 115 receives the request from host system 120 or from some other component connected to or within memory sub-system 110. Depending on the embodiment, the request can be to perform at least one of a program operation or a read operation. Accordingly, the request can include data to be programmed (e.g., a codeword) to memory device 130 or identify data to be read from memory device 130 of memory sub-system 110.

At operation 310, a value is determined. For example, the processing logic can determine a value, such as memory segment identifier 210, associated with the memory access operation. The memory segment identifier 210 can be any value that uniquely identifies a location or group of locations (e.g., a wordline of a block) of a segment of a memory device, such as memory device 130. In one embodiment, the memory segment identifier 210 has a location-based dependency on at least one other value. For example, the memory segment identifier 210 could include a portion of the row index from the memory array 104 of memory device 130, a portion of the physical block address (PBA), or some other value associated with the wordline on which the data is to be written. Depending on the embodiment, the request received at operation 305 can include the memory segment identifier 210, or codeword scrambling component 113 can determine the memory segment identifier 210 from some other source, such as a logical-to-physical (L2P) mapping table, system metadata, or some other data structure.

At operation 315, a hash function is applied. For example, the processing logic can apply a hash function, such as hash function 220, to the memory segment identifier determined at operation 310. In one embodiment, codeword scrambling component 113 applies hash function 220 to the memory segment identifier 210 to generate a hashed seed 225. Hash function 220 can include any function that can be used to map input data (e.g., memory segment identifier 210) to an output hash (e.g., hashed seed 225). In one embodiment, the hash function 220 includes Fowler-Noll-Vo (FNV) hash function. For example, the FNV hash function can take each byte of the input (e.g., memory segment identifier 210) multiply that byte by a FNV prime number, and then XOR the result with the byte. Alternatively, that order of operations could be reversed. In other embodiments, the hash function 220 can include some other hash function that can map input data (e.g., memory segment identifier 210) to the output hash (e.g., hashed seed 225).

At operation 320, a randomized string is generated. For example, the processing logic can provide the result of the hash function (e.g., the hashed seed 225) to a pseudo-random number generator, such as one or more of linear feedback shift registers 230, 232, 234, and 236, to generate the randomized string. In one embodiment, the hashed seed 225 (or other output of the hash function 220) is used as a seed value for the one or more of linear feedback shift registers 230, 232, 234, and 236. During each clock cycle, the one or more of feedback shift registers 230, 232, 234, and 236 can perform selected logic operations (e.g., Boolean logic operations) on certain bits of the seed to create a new bit value, shifts all the bits in the seed, and appends the new bit value at the start. The output bit falls off the end of the seed value, and as numerous clock cycles are repeated, a randomized sequence is generated. The process can be repeated for a number of clock cycles until the output sequence (e.g., randomized string 240) reaches a desired length.

At operation 325, a memory access operation is performed. For example, the processing logic can perform the memory access operation, responsive to the request received at operation 305, on the memory device 130 using the randomized string 240. Depending on the embodiment, the memory access operation can include, for example, a program operation or a read operation. When the memory access operation includes a program operation, codeword scrambling component 113 can scramble a codeword received with the request using the randomized string 240, the codeword comprising encoded data to be written to physical memory cells of the memory device, and program the scrambled codeword to a segment of the memory device 130 associated with the memory segment identifier determined at operation 310. When the memory access operation includes a read operation, codeword scrambling component 113 can read a scrambled sense word from a segment of the memory device 130 associated with the memory segment identifier determined at operation 310 and descramble the scrambled sense word using the randomized string 240. In one embodiment, for either a program operation or a read operation, the randomized string 240 can be logically combined with the data being programmed or read (e.g., via an XOR operation).

Figure 4:
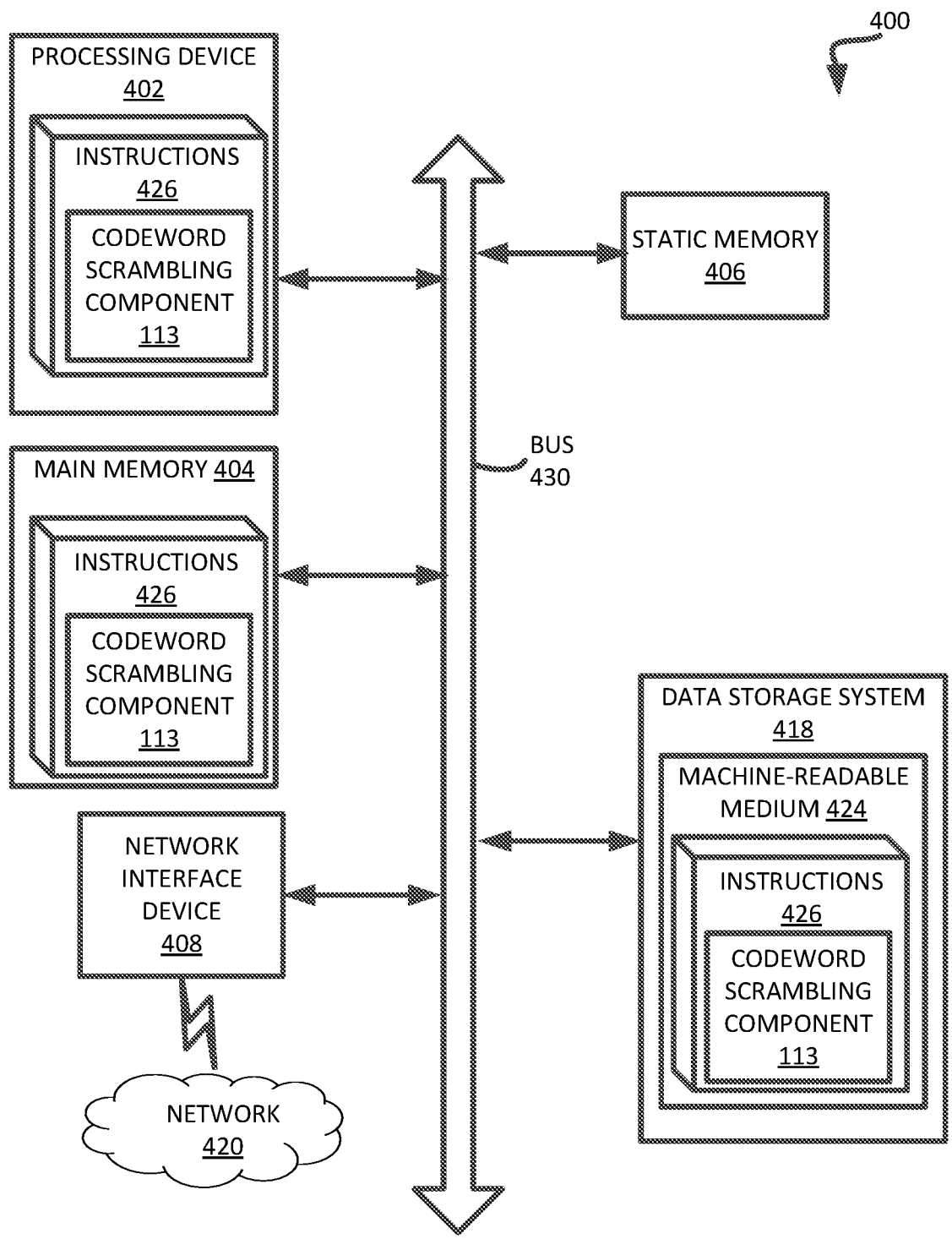
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the codeword scrambling component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1A.

In one embodiment, the instructions 426 include instructions to implement functionality corresponding to the codeword scrambling component 113 of FIG. 1A). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
receiving a request to perform a memory access operation on the memory device;
determining a memory segment identifier associated with a physical portion of the memory device to which the memory access operation is directed;
applying a hash function to the memory segment identifier to generate a hashed seed based on the memory segment identifier;
providing the hashed seed based on the memory segment identifier to a pseudo-random number generator to generate a randomized string; and
performing the memory access operation on the memory device using the randomized string.

2. The system of claim 1, wherein the memory access operation comprises a program operation.

3. The system of claim 2, wherein performing the memory access operation on the memory device comprises scrambling a codeword received with the request using the randomized string, the codeword comprising encoded data to be written to physical memory cells of the memory device, and programming the scrambled codeword to a segment of the memory device associated with the memory segment identifier.

4. The system of claim 1, wherein the memory access operation comprises a read operation.

5. The system of claim 4, wherein performing the memory access operation on the memory device comprises reading a scrambled sense word from a segment of the memory device associated with the memory segment identifier and descrambling the scrambled sense word using the randomized string.

6. The system of claim 1, wherein the memory segment identifier comprises at least one of a physical block address or a wordline index of a memory segment of the memory device.

7. The system of claim 1, wherein the hash function comprises the Fowler-Noll-Vo (FNV) hash function.

8. The system of claim 1, wherein the pseudo-random number generator comprises a linear feedback shift register.

9. A method comprising:
receiving a request to perform a memory access operation on a memory device;
determining a memory segment identifier associated with a physical portion of the memory device to which the memory access operation is directed;
applying a hash function to the memory segment identifier to generate a hashed seed based on the memory segment identifier;
providing the hashed seed based on the memory segment identifier to a pseudo-random number generator to generate a randomized string; and
performing the memory access operation on the memory device using the randomized string.

10. The method of claim 9, wherein the memory access operation comprises a program operation.

11. The method of claim 10, wherein performing the memory access operation on the memory device comprises scrambling a codeword received with the request using the randomized string, the codeword comprising encoded data to be written to physical memory cells of the memory device, and programming the scrambled codeword to a segment of the memory device associated with the memory segment identifier.

12. The method of claim 9, wherein the memory access operation comprises a read operation.

13. The method of claim 12, wherein performing the memory access operation on the memory device comprises reading a scrambled sense word from a segment of the memory device associated with the memory segment identifier and descrambling the scrambled sense word using the randomized string.

14. The method of claim 9, wherein the memory segment identifier comprises at least one of a physical block address or a wordline index of a memory segment of the memory device.

15. The method of claim 9, wherein the hash function comprises the Fowler-Noll-Vo (FNV) hash function.

16. The method of claim 9, wherein the pseudo-random number generator comprises a linear feedback shift register.

17. A non-transitory computer-readable storage medium comprising instructions that, when executed by a processing device, cause the processing device to perform operations comprising:
   receiving a request to perform a memory access operation on a memory device;
   determining a seed value having a location-based dependency on at least one other seed value;
   applying a hash function to the seed value to generate a hash of the seed value;
   generating, using the hash of the seed value, a randomized sequence of a desired length; and
   performing the memory access operation on the memory device using the randomized sequence.

18. The non-transitory computer-readable storage medium of claim 17, wherein the memory access operation comprises a program operation, and wherein performing the memory access operation on the memory device comprises scrambling a codeword received with the request using the randomized string, the codeword comprising encoded data to be written to physical memory cells of the memory device, and programming the scrambled codeword to a segment of the memory device.

19. The non-transitory computer-readable storage medium of claim 17, wherein the memory access operation comprises a read operation, wherein performing the memory access operation on the memory device comprises reading a scrambled sense word from a segment of the memory device associated with the memory segment identifier and descrambling the scrambled sense word using the randomized sequence.

20. The non-transitory computer-readable storage medium of claim 17, wherein generating the randomized sequence comprises providing the hash of the seed value to a linear feedback shift register and executing the linear feedback shift register for a number of clock cycles until an output of the linear feedback shift register reaches the desired length, the output comprising the randomized sequence.

* * * * *